(12) United States Patent
Yoo et al.

(10) Patent No.: US 9,768,799 B1
(45) Date of Patent: Sep. 19, 2017

(54) ANALOG TO DIGITAL CONVERTER INCLUDING DIFFERENTIAL VCO

(71) Applicant: Industry University Cooperation Foundation Hanyang University, Seoul (KR)

(72) Inventors: Changsik Yoo, Seoul (KR); Donghyeok Jeong, Seongnam-si (KR); Jinho Noh, Seoul (KR)

(73) Assignee: Industry University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 15/463,704

(22) Filed: Mar. 20, 2017

(30) Foreign Application Priority Data

Mar. 21, 2016 (KR) .................. 10-2016-0033362
Mar. 3, 2017 (KR) .................. 10-2017-0027481

(51) Int. Cl.
| | |
|---|---|
| H03M 9/00 | (2006.01) |
| H03M 3/00 | (2006.01) |
| H03K 3/03 | (2006.01) |
| H03K 19/21 | (2006.01) |
| H03M 7/16 | (2006.01) |

(52) U.S. Cl.
CPC .......... *H03M 3/464* (2013.01); *H03K 3/0315* (2013.01); *H03K 19/21* (2013.01); *H03M 3/422* (2013.01); *H03M 3/436* (2013.01); *H03M 3/496* (2013.01); *H03M 7/165* (2013.01)

(58) Field of Classification Search
CPC ...... H03M 3/422; H03M 3/464; H03M 3/436; H03M 3/496; H03M 7/165; H03K 3/0315
USPC .................................................. 341/110–143
See application file for complete search history.

(56) References Cited

U.S. PATENT DOCUMENTS

| | | | |
|---|---|---|---|
| 4,620,288 A | 10/1986 | Welmers | |
| 5,568,099 A * | 10/1996 | Du | .......... H03K 3/012 327/543 |
| 5,923,287 A * | 7/1999 | Lennen | .......... G01S 19/33 342/357.73 |
| 6,429,693 B1 | 8/2002 | Staszewski et al. | |
| 6,546,554 B1 * | 4/2003 | Schmidt | .......... G06F 8/61 709/201 |

(Continued)

FOREIGN PATENT DOCUMENTS

| | | |
|---|---|---|
| KR | 10-2011-0090884 A | 8/2011 |
| KR | 10-2012-0037582 A | 4/2012 |

*Primary Examiner* — Lam T Mai
(74) *Attorney, Agent, or Firm* — Jefferson IP Law, LLP

(57) ABSTRACT

An analog to digital converter is provided. The analog to digital converter includes: an arithmetic operator combining an analog input signal with a feedback signal; a loop filter filtering an output signal of the arithmetic operator; a quantizer quantizing an output signal of the loop filter to output a digital signal; and a feedback converting the digital signal to output a feedback signal, in which the quantizer includes: a plurality of VCOs each receiving a positive output signal and a negative output signal of the loop filter and outputting VCO signals; a plurality of samplers receiving the VCO signals output from the plurality of VCOs, respectively and outputting sampled signals; and a phase detector detecting a phase difference in the sampled signals output from the plurality of samplers, respectively, to detect a phase difference in two VCO signals output from the plurality of VCOs, respectively.

10 Claims, 12 Drawing Sheets

(56) References Cited

U.S. PATENT DOCUMENTS

| | | | | |
|---|---|---|---|---|
| 7,548,120 | B2* | 6/2009 | Lam | G06F 1/08 |
| | | | | 331/179 |
| 7,924,197 | B1* | 4/2011 | Liu | H03M 1/002 |
| | | | | 341/136 |
| 2002/0171499 | A1* | 11/2002 | Momtaz | H03J 5/244 |
| | | | | 331/117 FE |
| 2007/0040718 | A1* | 2/2007 | Lee | H03M 7/3008 |
| | | | | 341/143 |
| 2010/0103003 | A1 | 4/2010 | Deval et al. | |
| 2011/0032044 | A1* | 2/2011 | Lee | H03B 5/1228 |
| | | | | 331/117 FE |
| 2012/0008723 | A1* | 1/2012 | Stojanovic | H03L 7/091 |
| | | | | 375/355 |
| 2012/0112936 | A1* | 5/2012 | Huang | H03M 1/502 |
| | | | | 341/110 |
| 2016/0344404 | A1* | 11/2016 | Miglani | H03M 3/464 |

* cited by examiner

ANALOG TO DIGITAL CONVERTER INCLUDING DIFFERENTIAL VCO

CROSS-REFERENCE TO RELATED APPLICATIONS

This application claims priority from Korean Patent Application No. 10-2016-0033362 filed on Mar. 21, 2016 and Korean Patent Application No. 10-2017-0027481 filed on Mar. 3, 2017 in the Korean Intellectual Property Office the disclosure of which is incorporated herein by reference in its entirety.

BACKGROUND OF THE INVENTION

Field of the Invention

Apparatuses and methods consistent with the present disclosure relate to an analog to digital converter including a differential VCO, and more particularly, to an analog to digital converter including a differential VCO that uses a phase domain and reduces an area and power consumption.

Description of the Related Art

Recently, there is an increasing demand for multi-mode or multi-band in wireless communication. To this end, researches on a digital RF front-end are actively under way. In particular, to support the multi-mode or the multi-band, we are trying to reduce a use of a fixed filter such as a SAW filter as much as possible and to use a flexible type filter or to embed a filter function in a device.

To implement the digital RF front-end, an RF signal itself should be sampled and digitized, and the so digitized signal has greatly improved flexibility and reconfigurability. Therefore, many researchers are studying a data conversion device capable of performing high-speed sampling. In particular, a delta sigma modulator is being actively researched.

FIG. 1A is a diagram illustrating a schematic configuration of the existing frequency based VCO delta sigma modulator.

Referring to FIG. 1A, the existing frequency based VCO delta sigma modulator, that is, a frequency type delta sigma modulator receives voltage information of a VCO and samples output frequency information of the VCO. Further, the VCO is used as a function of the quantizer, and therefore replaces a general comparator.

However, since a V-to-frequency transfer function of the VCO is operated non-linearly, there is a disadvantage in that a harmonic distortion occurs in an output signal.

To solve the problem, a phase frequency based VCO delta sigma modulator that compares a phase between a reference signal and a VCO output signal has been proposed.

FIG. 1B is a diagram illustrating a schematic configuration of the existing phase frequency based VCO delta sigma modulator.

Referring to FIG. 1B, the existing phase frequency based VCO delta sigma modulator, that is, the phase frequency type delta sigma modulator receives the voltage information of the VCO and samples output phase information of the VCO.

The phase frequency type delta sigma modulator has an advantage in that a function of a comparator and an integrator may be implemented simultaneously because a V-to-phase transfer function has the integration relation. In addition, the phase frequency type delta sigma modulator has an advantage in that nonlinear characteristics of the VCO input/output is less affected than that of the existing frequency type delta sigma modulator and thus the harmonic distortion appearing in the output signal is reduced.

Meanwhile, the VCO generally consists of digital logic. Characteristics of the digital logic may be changed very greatly depending on process or temperature conditions. If the conditions are changed, a frequency appearing at the output of the VCO appears different even when the same DC voltage is applied to the input of the VCO. At this point, when a reference frequency and a common frequency of the VCO are different from each other, a DC offset occurs in the output signal of the converter. The DC offset limits an output range of a feedback digital to analog converter and may lead to a reduction in a dynamic range, which limits the performance of the analog to digital converter.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present disclosure provides an analog to digital converter including a differential VCO that increases a range of an output signal and a dynamic range, does not require an additional circuit by not being affected by a reference frequency, and is advantageous in area, power consumption and yield.

According to an aspect of the present disclosure, an analog to digital converter includes: an arithmetic operator combining an analog input signal with a feedback signal; a loop filter filtering an output signal of the arithmetic operator; a quantizer quantizing an output signal of the loop filter to output a digital signal; and a feedback converting the digital signal to output a feedback signal, in which the quantizer may include: a plurality of VCOs each receiving a positive output signal and a negative output signal of the loop filter and outputting VCO signals; a plurality of samplers receiving the VCO signals output from the plurality of VCOs, respectively and outputting sampled signals; and a phase detector detecting a phase difference in the sampled signals output from the plurality of samplers, respectively, to detect a phase difference in two VCO signals output from the plurality of VCOs, respectively.

The quantizer may detect the phase difference in the two VCO signals without inputting a reference frequency signal.

The quantizer may detect the phase difference regardless of a free-running frequency of the plurality of VCOs.

The plurality of VCOs may include: a first ring oscillator including N first inverters operated based on the positive output signal; and a second ring oscillator including N second inverters operated based on the negative output signal, and in the first ring oscillator, a negative output terminal of an i-th (i is an integer equal to or greater than 1 but equal to or less than N−1) first inverter of the N first inverters may be connected to a positive input terminal of an i+1-th first inverter of the N first inverters and a positive output terminal of the i-th first inverter may be connected to a negative input terminal of the i+1-th first inverter, when the N is an even number, a negative output terminal of an N-th first inverter of the N first inverters is connected to a negative input terminal of a 1st first inverter of the N first inverters and a positive output terminal of the N-th first inverter is connected to a positive input terminal of the 1st first inverter, and when the N is an odd number, the negative output terminal of the N-th first inverter is connected to the positive input terminal of the 1st first inverter and the positive output terminal of the N-th first inverter is connected to the negative input terminal of the 1st first inverter.

The plurality of samplers may include: a first sampler including N first D flip flops connected to output terminals of the N first inverters, respectively; and a second sampler including N second D flip flops connected to output terminals of the N second inverters, respectively, and in the first sampler, a non-inverting input terminal of an i-th first D flip flop may be connected to the positive output terminal of the i-th first inverter and an inverting input terminal of the i-th first D flip flop may be connected to the negative output terminal of the i-th first inverter.

The phase detector may include N XOR gates performing an XOR operation on N sampled signals of the first sampler and N sampled signals of the second sampler, respectively, and an input terminal of an i-th XOR gate of the N XOR gates may be connected to an output terminal of the i-th first D flip flop and an output terminal of the i-th second D flip flop.

The feedback may include: a data weighted averaging (DWA) connected to an output terminal of the quantizer; and a digital to analog converter (DAC) connected to an output terminal of the data weighted averaging and outputting the feedback signal, and the data weighed averaging may convert a quantized signal including detected phase information output from the quantizer into a thermometer code and convert the converted thermometer code into a DWA code.

According to another aspect of the present disclosure, an analog to digital converter includes: an arithmetic operator combining an analog input signal with a feedback signal; a loop filter filtering an output signal of the arithmetic operator; a quantizer quantizing an output signal of the loop filter to output a digital signal; a data weighted averaging (DWA) connected to an output terminal of the quantizer; and a digital to analog converter (DAC) connected to an output terminal of the data weighted averaging and outputting the feedback signal, in which the data weighed averaging may convert a digital signal including detected phase information output from the quantizer into a thermometer code and convert the converted thermometer code into a DWA code.

The data weighed averaging may include: a barrel shifter having one terminal connected to an output terminal of the quantizer and the other terminal connected to the digital to analog converter; a rising edge detector detecting a rising edge of a digital signal output from the quantizer; a first binary code converter converting an output signal of the rising edge detector into a binary code; a flip flops sampling output signal of the barrel shifter; a falling edge detector detecting a falling edge of an output signal of the flip flops; a second binary code converter converting an output signal of the falling edge detector into the binary code; and a bit operator performing a subtraction operation on an output signal of the first binary code converter and an output signal of the second binary code converter.

The barrel shifter may perform an operation based on an output signal of the bit operator.

As described above, according to various embodiments of the present disclosure, the analog to digital converter including a differential VCO may increase the range of the output signal and the dynamic range, does not require the additional circuit by not being affected by the reference frequency, and may be advantageous in the area, the power consumption and the yield.

BRIEF DESCRIPTION OF THE DRAWING FIGURES

The above and/or other aspects of the present invention will be more apparent by describing certain exemplary embodiments of the present invention with reference to the accompanying drawings, in which.

DETAILED DESCRIPTION OF THE EXEMPLARY EMBODIMENTS

Figure 1A:
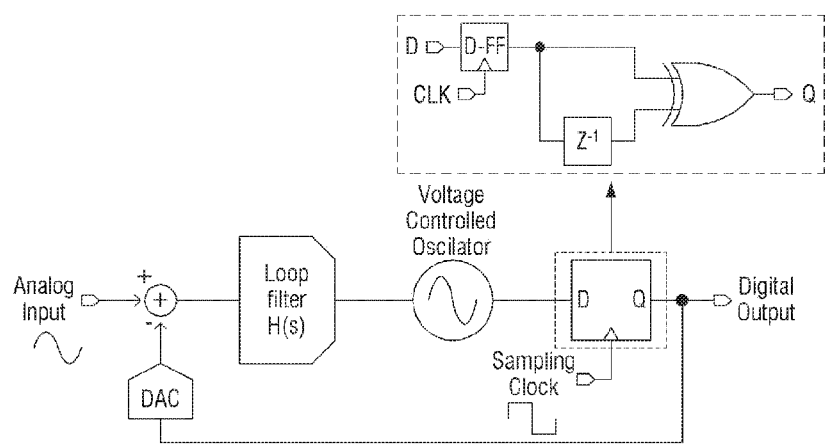
FIG. 1A is a diagram illustrating a schematic configuration of the existing frequency based VCO delta sigma modulator.
Figure 1B:
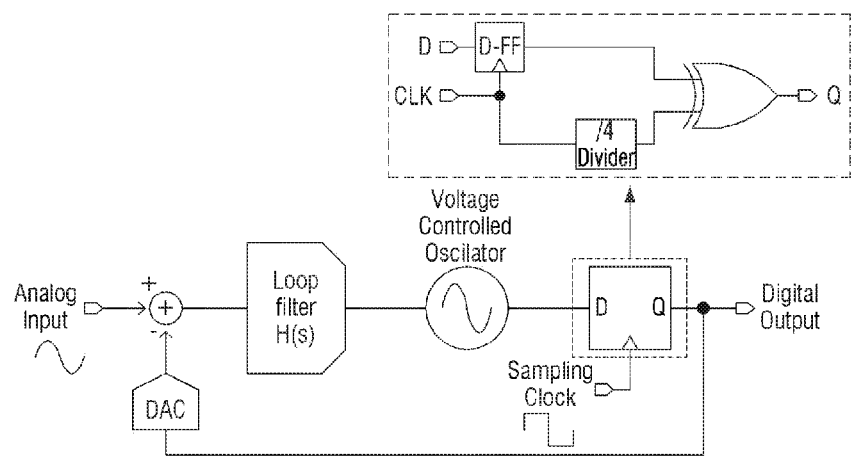
FIG. 1B is a diagram illustrating a schematic configuration of the existing phase frequency based VCO delta sigma modulator.

Hereinafter, various exemplary embodiments of the present disclosure will be described in more detail with reference to the accompanying drawings. The exemplary embodiments disclosed in the present specification may be variously modified. Specific embodiments are described in the drawings and may be described in detail in the detailed description. It should be understood, however, that the specific embodiments disclosed in the accompanying drawings are intended only to facilitate understanding of various embodiments. Accordingly, it is to be understood that the technical idea is not limited by the specific embodiments disclosed in the accompanying drawings, but includes all equivalents or alternatives falling within the spirit and scope of the disclosure.

Terms including an ordinal number such as 'first', 'second', etc. may be used to describe various components, but the components are not to be construed as being limited to the terms. The terms are used to distinguish one component from another component.

Throughout this specification, it will be understood that the term "comprise" and variations thereof, such as "comprising" and "comprises", specify the presence of features, numbers, steps, operations, components, parts, or combinations thereof, described in the specification, but do not preclude the presence or addition of one or more other features, numbers, steps, operations, components, parts, or combinations thereof. It is to be understood that when one component is referred to as being "connected to" or "coupled to" another element, it may be connected directly to or coupled directly to another element or be connected to or coupled to another element, having the other element intervening therebetween. On the other hand, it is to be understood that when one element is referred to as being "connected directly to" or "coupled directly to" another element, it may be connected to or coupled to another element without the other element intervening therebetween.

In the meantime, "module" or "unit" for components used in the present specification performs at least one function or operation. Further, "module" or "unit" may perform functions or operations by hardware, software, or a combination of hardware and software. Further, a plurality of "modules" or a plurality of "units" other than a "module" or "unit" that is to be performed in a specific hardware or performed in at least one processor may be integrated into at least one module. Singular forms used herein are intended to include plural forms unless context explicitly indicates otherwise.

In addition, in describing the present disclosure, if it is determined that the detail description of relevant known functions or components makes subject matters of the present disclosure obscure, the detailed description thereof will be shortened or omitted.

Figure 2:
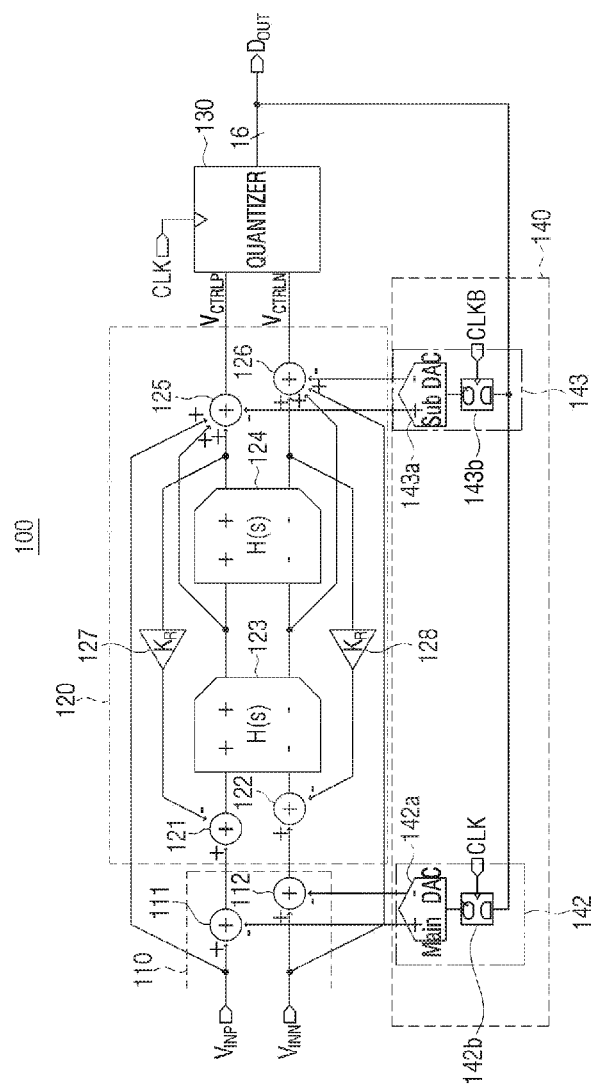
FIGS. 2 and 3 are diagrams illustrating a schematic configuration of an analog to digital converter including a differential VCO according to an exemplary embodiment of the present disclosure.
Figure 3:
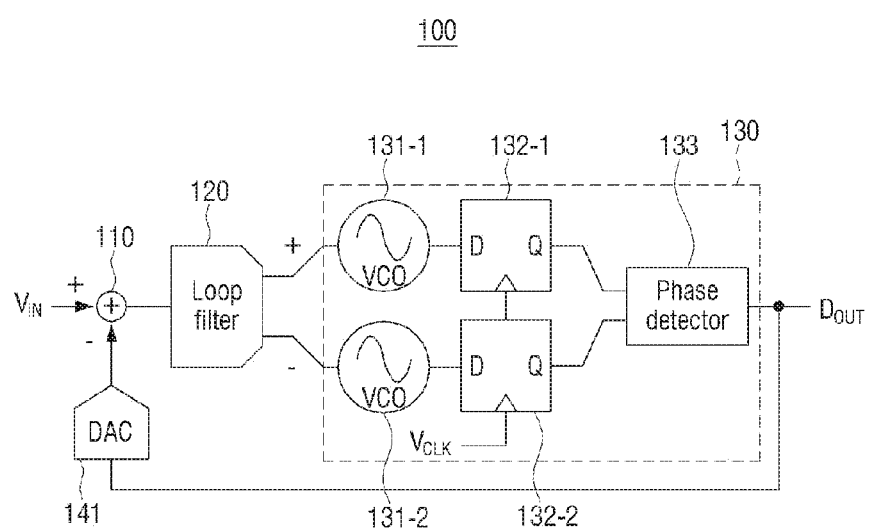

FIGS. 2 and 3 are diagrams illustrating a schematic configuration of an analog to digital converter including a differential voltage controlled oscillator (VCO) according to an exemplary embodiment of the present disclosure.

Referring to FIG. 2, an analog to digital converter 100 according to an embodiment of the present disclosure may be a delta sigma modulator. The analog to digital converter 100 includes an arithmetic operator 110 (for example, an adder and/or a subtractor), a loop filter 120, a quantizer 130, and a feedback 140. Hereinafter, functions of each component will be described in detail.

First, the arithmetic operator 110 combine an analog input signal with a feedback signal. The arithmetic operator 110 may calculate an accurate signal by subtracting an error of an output signal based on an input signal. That is, the arithmetic operator 110 perform a subtraction operation on an analog input signal and a feedback signal.

According to an exemplary embodiment, the arithmetic operator 110 may include two arithmetic operators 111 and 112. The analog input signal includes a positive input signal VINP and a negative input signal VINN and the feedback signal includes a positive feedback signal VFBP and a negative feedback signal VFBN. A first arithmetic operator 111 of the two arithmetic operators 111 and 112 may combine the positive input signal VINP with the positive feedback signal VFBP. Further, the second arithmetic operator 112 may combine the negative input signal VINN with the negative feedback signal VFBN.

Next, the loop filter 120 filters an output signal of the arithmetic operator 110. In this case, the loop filter 120 includes a third arithmetic operator 121, a fourth arithmetic operator 122, a first loop filter 123, a second loop filter 124, a fifth arithmetic operator 125, a sixth arithmetic operator 126, a first buffer 127, and a second buffer 128.

The third arithmetic operator 121 performs a subtraction operation on an output signal of the first arithmetic operator 111 and an output signal of a positive output terminal of the second loop filter 124 that has passed through the first buffer 127. Further, the fourth arithmetic operator 122 performs a subtraction operation on an output signal of the second arithmetic operator 112 and an output signal of a negative output terminal of the second loop filter 124 that has passed through the second buffer 128.

The first loop filter 123 is an analog integrator, and the output signal of the third arithmetic operator 121 is input to the positive input terminal and an output signal of the fourth arithmetic operator 122 is input to the negative input terminal. Further, the second loop filter 124 is also an analog integrator, and an output signal of a positive output terminal of the first loop filter 123 is input to the positive input terminal and a signal output from a negative output terminal of the first loop filter 123 is input to the negative input terminal.

The fifth arithmetic operator 125 combines the positive input signal VINP, the output signal of the positive output terminal of the first loop filter 123, the output signal of the positive output terminal of the second loop filter 124, and an output signal of a positive output terminal of a second digital to analog converter to be described below. The signal combined in the fifth arithmetic operator 125 forms a positive output signal VCTRLP of the loop filter 120. Further, the sixth arithmetic operator 126 combines the negative input signal VINN, the output signal of the negative output terminal of the first loop filter 123, the output signal of the negative output terminal of the second loop filter 124, and an output signal of a negative output terminal of the second digital to analog converter to be described below. The signal combined in the sixth arithmetic operator 126 forms a negative output signal VCTRLN of the loop filter 120.

The quantizer 130 quantizes the output signal of the loop filter 120 to output a digital signal. At this point, the quantizer 130 may include two identical oscillators (for example, a VCO). The quantizer 130 may use two identical VCOs to sample a phase of the VCO using only VCO signals output from two VCOs without using an external reference clock.

A configuration of the quantizer 130 will be described below.

Referring to FIG. 3, the analog to digital converter 100 according to the exemplary embodiment of the present disclosure is illustrated. As described above, the analog to digital converter 100 includes the arithmetic operator 110, the loop filter 120, the quantizer 130, and a digital to analog converter (DAC) 141. The analog to digital converter 100 may include the feedback and the digital to analog converter (DAC) may be included in the feedback. The arithmetic operator 110, the loop filter 120, and the digital to analog converter 141 have been described with reference to FIG. 2, and therefore the quantizer 130 will be described with reference to FIG. 3.

The quantizer 130 includes a plurality of VCOs 131-1 and 131-2, a plurality of samplers 132-1 and 132-2, and a phase detector 133.

Each of the plurality of VCOs 131-1 and 131-2 receives the output signal of the loop filter 120 and outputs a VCO signal. That is, the first VCO 131-1 receives the positive output signal from the loop filter 120 and the second VCO 131-2 receives the negative output signal from the loop filter 120. One terminal of the first VCO 131-1 is connected to the positive output terminal of the loop filter 120 and the other terminal thereof is connected to an input terminal of the first sampler 132-1. Further, one terminal of the second VCO 131-2 is connected to the negative output terminal of the loop filter 120 and the other terminal thereof is connected to an input terminal of the second sampler 132-2. Each of the plurality of VCOs 131-1 and 132-2 outputs the VCO signal. The VCO signal may be a target signal for phase detection.

The VCO signals output from the plurality of VCOs 131-1 and 132-2 are each input to the plurality of samplers 132-1 and 132-2.

Each of the plurality of samplers 132-1 and 132-2 receives the output VCO signals and outputs sampled signals. That is, the first sampler 132-1 outputs the sampled signal at a predetermined period from a first VCO signal output from the first VCO 131-1. Further, the second sampler 132-2 outputs the sampled signal at a predetermined period from a second VCO signal output from the second VCO 131-2. The predetermined period is determined depending on a clock period commonly applied to the plurality of samplers 132-1 and 132-2. One terminal of the first sampler 132-1 is connected to an output terminal of the first VCO 131-1 and the other terminal thereof is connected to an input terminal of the phase detector 133. Further, one terminal of the second sampler 132-2 is connected to an output terminal of the second VCO 131-2 and the other terminal thereof is connected to the input terminal of the phase detector 133. Each sampled signal output from the plurality of samplers 132-1 and 132-2 is input to the phase detector 133.

The phase detector 133 detects phases of the sampled signals input from the plurality of samplers 132-1 and 132-2. The phase detector 133 outputs a digital signal including the detected phase information. The output digital signal is input to the arithmetic operator 110 via the digital to analog converter 141.

To detect the accurate phase by the phase detector 133, periods of the differential signals input to the phase detector 133 need to match each other. However, when logic circuit components are fabricated, the characteristics of the logic circuit components may be greatly changed depending on the change in process and temperature. The plurality of samplers 132-1 and 132-2 sample a signal at a predetermined period, and therefore may be less affected by the difference in characteristics of the components. However, the VCO outputs the analog signal, and therefore a cycle of the output analog signal may be different for each component. The existing analog to digital converter includes one VCO, and therefore requires a separate circuit for outputting a reference signal. Further, as described above, the characteristics of the VCO may be changed depending on the change in process or temperature, and the change in the characteristics affects the performance of the analog to digital converter. Therefore, the existing analog to digital converter requires a separate circuit for matching frequencies (or periods) of the VCO and the reference signal output circuit.

However, the components included in one product may be simultaneously manufactured under the same conditions. Therefore, the plurality of VCOs included in one analog to digital converter may be manufactured under the same conditions at the same time. Therefore, even if there may occur a characteristic difference from the VCO included in the other apparatus, there is no difference in characteristics between the plurality of VCOs included in one analog to digital converter.

Since the plurality of VCOs 131-1 and 131-2 are used and there is no difference in characteristics of the plurality of VCOs 131-1 and 132-2, the analog to digital converter 100 may detect a phase without the input of the reference frequency signal and does not require a separate additional circuit.

Further, there is an advantage in that the analog to digital converter 100 including the plurality of VCOs integrates, detects and feeds back the phase difference using the differential signal and subtracts the detected phase from an original signal, thereby reducing a harmonic distortion.

A circuit of the quantizer 130 will be described below.

Figure 4:
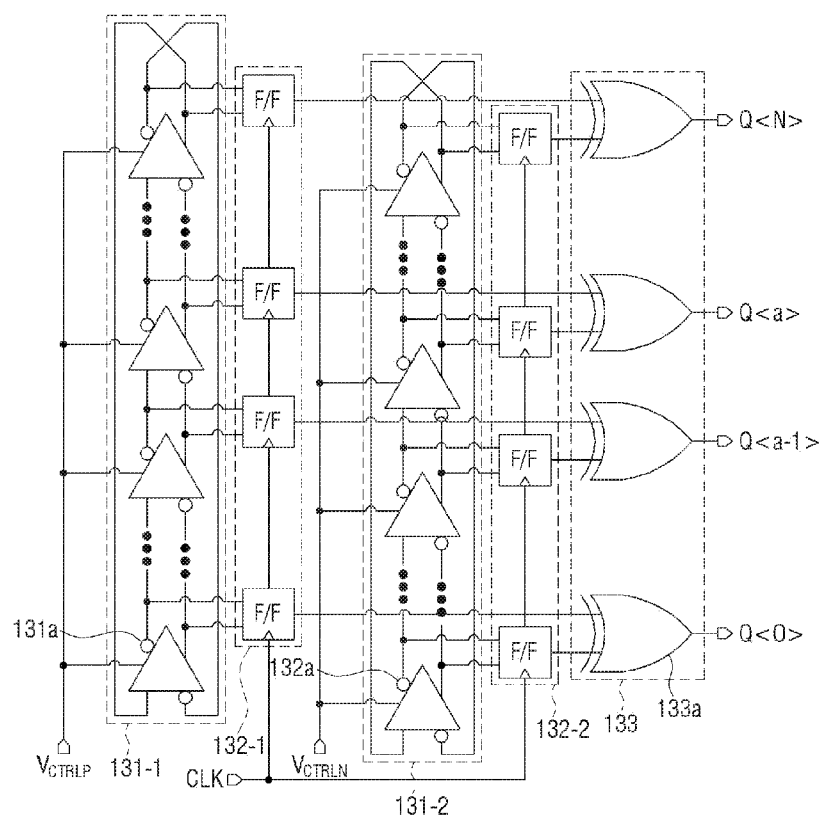
FIG. 4 is a diagram illustrating a schematic configuration of a quantizer according to an exemplary embodiment of the present disclosure.

FIG. 4 is a diagram illustrating a schematic configuration of a quantizer according to an exemplary embodiment of the present disclosure.

Referring to FIG. 4, the quantizer 130 includes a first ring oscillator 131-1, a second oscillator 131-2, N (integer of three or more) first samplers 132-1, N second samplers 132-2, and N XOR gates 133a.

As described above, the quantizer 130 includes the plurality of VCOs, the plurality of samplers, and the phase detector. The plurality of VCOs may be implemented by the first ring oscillator 131-1 and the second ring oscillator 131-2. The plurality of samplers may be implemented by the first sampler 132-1 and the second sampler 132-2 that include a plurality of D flip flops. Further, the phase detector may be implemented by the plurality of XOR gates 133a.

The first ring oscillator 131-1 includes N first inverters 131a that operate based on the positive output signal VCTRLP of the loop filter 120.

At this point, the negative output terminal of an i-th (i is an integer of 1 or more and N−1 or less) first inverter of the N first inverters 131a is connected to a positive input terminal of an i+1-th first inverter of the N first inverters 131a. Further, the positive output terminal of the i-th first inverter is connected to a negative input terminal of the i+1-th first inverter. As illustrated in FIG. 4, when N is an even number, the negative output terminal of the N-th first inverter of the N first inverters 131a is connected to the negative input terminal of the 1st first inverter of the N first inverters 131a. Further, the positive output terminal of the N-th first inverter is connected to the positive input terminal of the 1st first inverter. Further, although not illustrated in the drawings, when N is an odd number, the negative output terminal of the N-th first inverter is connected to the positive input terminal of the 1st first inverter, and the positive output terminal of the N-th first inverter is connected to the negative input terminal of the 1st first inverter.

The second ring oscillator 132-2 includes N second inverters 132a that operate based on the negative output signal VCTRLN of the loop filter 120.

At this point, a negative output terminal of an i-th second inverter of the N second inverters 132a is connected to a positive input terminal of an i+1-th second inverter of N second inverters 331B. Further, a positive output terminal of the i-th second inverter is connected to a negative input terminal of the i+1-th second inverter. As illustrated in FIG. 4, when N is an even number, a negative output terminal of an N-th second inverter of the N second inverters 132a is connected to a negative input terminal of a 1st second inverter of the N second inverters 132a. Further, the positive output terminal of the N-th second inverter is connected to the positive input terminal of the 1st second inverter. Further, although not illustrated in the drawings, when N is an odd number, the negative output terminal of the N-th second inverter is connected to the positive input terminal of the 1st second inverter, and the positive output terminal of the N-th second inverter is connected to the negative input terminal of the 1st second inverter.

Each of the N first samplers 132-2 is connected to the output terminals of the N first inverters 131a, respectively, and may include a D flip-flop. At this point, a non-inverting input terminal of the D flip-flop of the i-th first sampler of the N first samplers 132-1 is connected to the positive output terminal of the i-th first inverter, and an inverting input terminal of the D flip flop of the i-th first sampler is connected to the negative output terminal of the i-th first inverter.

Each of the N second samplers 132-2 is connected to the output terminals of the N second inverters 132a, respectively, and may include a D flip-flop. At this point, a non-inverting input terminal of the D flip-flop of the i-th second sampler of the N second samplers 132-2 is connected to the positive output terminal of the i-th second inverter, and an inverting input terminal of the D flip flop of the i-th second sampler is connected to the negative output terminal of the i-th second inverter.

The N XOR gates 133a perform an XOR operation on the output signals of the N first samplers 132-1 and the output signals of the N second samplers 132-2. That is, the i-th XOR gate of the N XOR gates 133a may perform an XOR operation on the output signal of the output terminal of the D flip flop of the i-th first sampler and the output signal of the output terminal of the D flip flop of the i-th second sampler. Further, the N-th XOR gate of the N XOR gates 133a may perform an XOR operation on the output signal of the output terminal of the D flip flop of the N-th first sampler and the output signal of the output terminal of the D flip flop of the N-th second sampler.

The analog to digital converter 100 includes the ring oscillator including the plurality of inverters and the sampler including the plurality of D flip flop, thereby implementing the quantizer having higher resolution.

Figure 5:
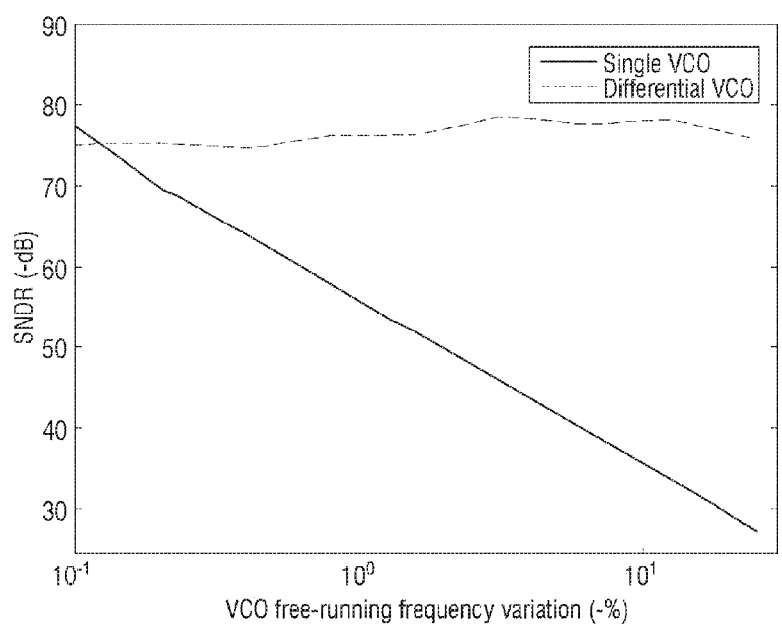
FIG. 5 is a comparison diagram of test results of an analog to digital converter according to an exemplary embodiment of the present disclosure and an analog to digital converter including a single VCO.

FIG. 5 is a comparison diagram of test results of an analog to digital converter according to an exemplary embodiment of the present disclosure and an analog to digital converter including a single VCO.

FIG. 5 illustrates a signal-to-noise distortion ratio (SNDR) between an analog to digital converter including a plurality of VCOs depending on a free-running frequency variation and an analog to digital converter including a single VCO. The free-running frequency generally refers to a frequency at which the oscillator is driven when there is no drive signal. As illustrated in FIG. 5, the analog to digital converter including the single VCO, the SNDR is drastically changed depending on the free-running frequency variation. However, the analog to digital converter including the plurality of VCOs maintains a constant SNDR regardless of the free-running frequency variation. Therefore, it may be seen that the analog to digital converter including the plurality of VCOs is driven more stably than the analog to digital converter including the single VCO.

Meanwhile, the analog to digital converter may further include a data weighted averaging (DWA). The data weighted averaging may perform a data weighted average algorithm to remove errors due to mismatch.

The data weighted averaging will be described below.

Figure 6:
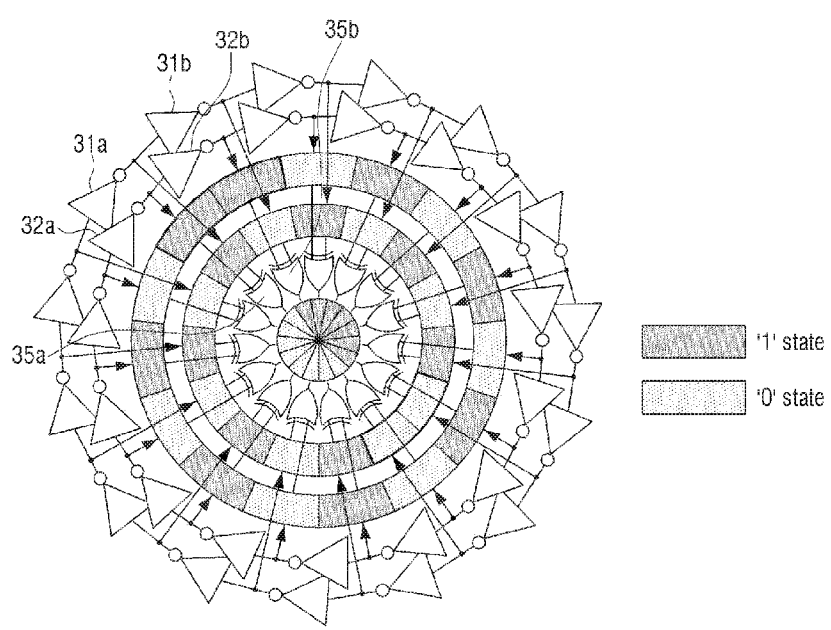
FIG. 6 is a diagram for explaining a digital output signal of a VCO according to an exemplary embodiment of the present disclosure.

FIG. 6 is a diagram for explaining a digital output signal of a VCO according to an exemplary embodiment of the present disclosure.

The data weighted averaging of the present disclosure may convert the digital signal including the detected phase information output from the quantizer into the thermometer code and convert the converted thermometer code into a DWA code. By converting the digital signal to the thermometer code and converting the converted thermometer code into the DWA code, the analog to digital converter reduces noise and delay to increase a sampling frequency.

First, the digital signal output from the quantizer will be described.

Referring to FIG. 6, the quantizer is illustrated in a ring form. The ring implemented by outer inverters 31a and 31b may be the first ring oscillator and the ring implemented by inner inverters 32a and 32b may be the second ring oscillator. The second sampled value based on an output value of the second ring oscillator is illustrated inside the second ring oscillator in the ring form and the first sampled value based on an output value of the first ring oscillator is illustrated inside the second sampled value in the ring form. The XOR gate is illustrated inside the first sampled value in the ring form and a value obtained by performing the XOR operation on the first sampled value and the second sampled value is illustrated inside the XOR gate.

That is, the ring-shaped configuration illustrated in FIG. 6 may correspond to the first ring oscillator, the second ring oscillator, the second sampler, the first sampler, and the phase detector sequentially from the outside to the inside.

The output value of the inverter included in the first ring oscillator and the output value of the inverter included in the second ring oscillator may be alternately output as 0 and 1 states. However, the output value of the inverter included in the first ring oscillator and the output value of the inverter included in the second ring oscillator may be continuously output as 0 or 1. A section where the output value of the inverter included in the first ring oscillator is continuously output with the same value and a section where the output value of the inverter included in the second ring oscillator is continuously output with the same value may be different from each other.

For example, a 1-1-th inverter 31a of the first ring oscillator may output 1 and a 2-1-th inverter 32a of the second ring oscillator may output 1. Further, a 1-2-th inverter 31b of the first ring oscillator may output 0 and a 2-2-th inverter 32b of the second ring oscillator may output 1. When the 1-1-th inverter 31a and the 2-1-th inverter 32a are XORed, 0 is output and the 1-2-th inverter 31b and the 2-2-th inverter are XORed, 1 is output. That is, the output value of the phase detector is changed in the section in which the output value of the second ring oscillator is continued with the same value. In the same manner, as illustrated in FIG. 6, the output value of the phase detector is changed in the section where the output value of the first ring oscillator is continued with the same value. Further, the output value of the phase detector may be maintained as the same value until the output value of the phase detector is changed.

The data weighted averaging of the present disclosure uses the characteristic in which the output value of the quantizer is maintained for a predetermined period.

Figure 7A:
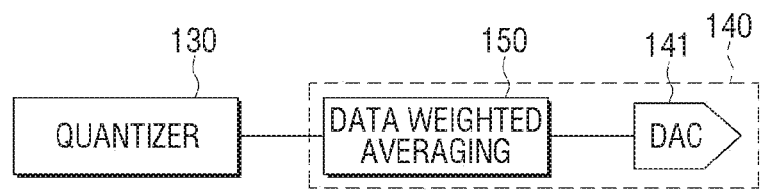
FIG. 7A is a block diagram of an analog to digital converter including data weighted averaging according to an exemplary embodiment of the present disclosure.

FIG. 7A is a block diagram of an analog to digital converter including data weighted averaging according to an exemplary embodiment of the present disclosure.

Referring to FIG. 7A, the quantizer 130 and the feedback 140 are illustrated. The feedback 140 converts the digital signal that is the output signal of the quantizer 130 and outputs a feedback signal. The feedback 140 may include the data weighted averaging 150 and the digital to analog converter 141. Further, the feedback 140 may further include a digital to analog converter. An input terminal of the data weighted averaging 150 may be connected to the output terminal of the quantizer 130 and an output terminal thereof may be connected to an input terminal of the digital to analog converter 141.

Figure 7B:
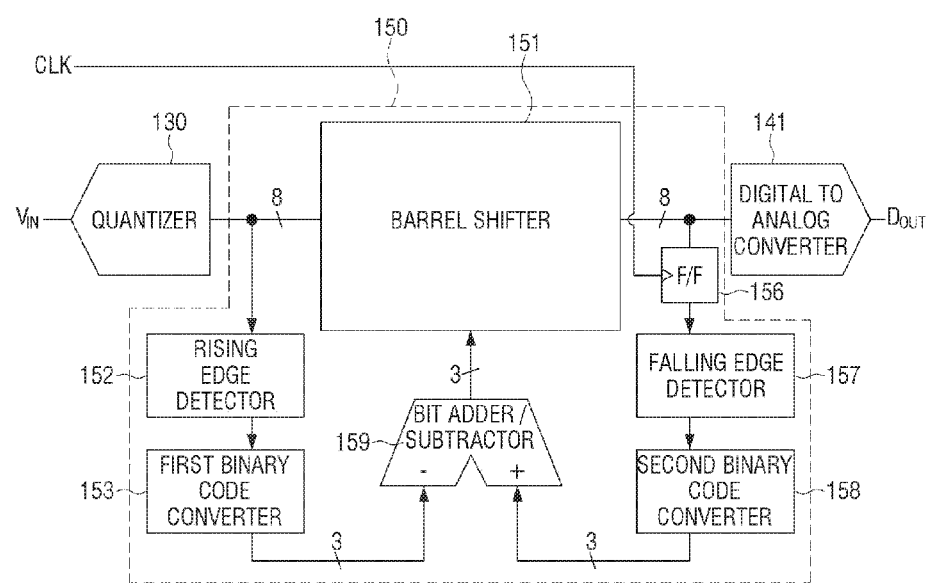
FIG. 7B is a diagram illustrating a detailed configuration of the data weighted averaging according to the exemplary embodiment of the present disclosure.

FIG. 7B is a diagram illustrating a detailed configuration of the data weighted averaging according to the exemplary embodiment of the present disclosure.

Referring to FIG. 7B, the data weighted averaging 150 includes a barrel shifter 151, a rising edge detector 152, a first binary code converter 153, a flip flop 156, a falling edge detector 157, a second binary code converter 158, and a bit operator 159 (for example, a bit adder and/or a bit subtractor).

The barrel shifter 151 is an apparatus capable of moving or rotating a plurality of bits in a data word by one operation and one terminal thereof is connected to an output terminal of the quantizer 130 and the other terminal thereof is connected to the digital to analog converter 141 and an operation thereof is controlled by the output signal of the bit operator 159.

The rising edge detector 152 detects the rising edge of the digital signal output from the quantizer 130 and the first binary code converter 153 converts the output signal of the rising edge detector 152 into a binary code.

As described above, the data weighted averaging 150 of the present disclosure may convert the digital signal including the detected phase information output from the quantizer into the thermometer code and convert the converted thermometer code into the DWA code.

The rising edge detector 152, the first binary code converter 153, the bit operator 159, and the barrel shifter 151 of the data weight averaging 150 may serve to convert the digital output value of the quantizer 130 into the thermometer code. Further, a falling edge detector 157, the second binary code converter 158, the bit operator 159, and the barrel shifter 151 of the data weight averaging 150 may serve to convert the converted thermometer code into the DWA code.

That is, the rising edge detector 157 detects a point changed from 0 to 1 in an output array of the quantizer 130, and the barrel shifter 151 may use the detected value to convert the output value of the quantizer 130 into the thermometer code. Further, the falling edge detector 157 detects a point changed from 1 to 0 in a thermometer array, and the barrel shifter 151 may use the detected value to convert the thermometer code into the DWA code.

A detailed conversion process will be described below.

Meanwhile, the data weighted averaging 150 of the present disclosure uses the same bit operator 159 and barrel shifter 151 to perform the conversion of the thermometer code and the conversion of the DWA code. That is, the data weighted averaging 150 may process the two conversion processes using the same component, thereby performing the miniaturization of the components and the fast DWA conversion.

Figure 8:
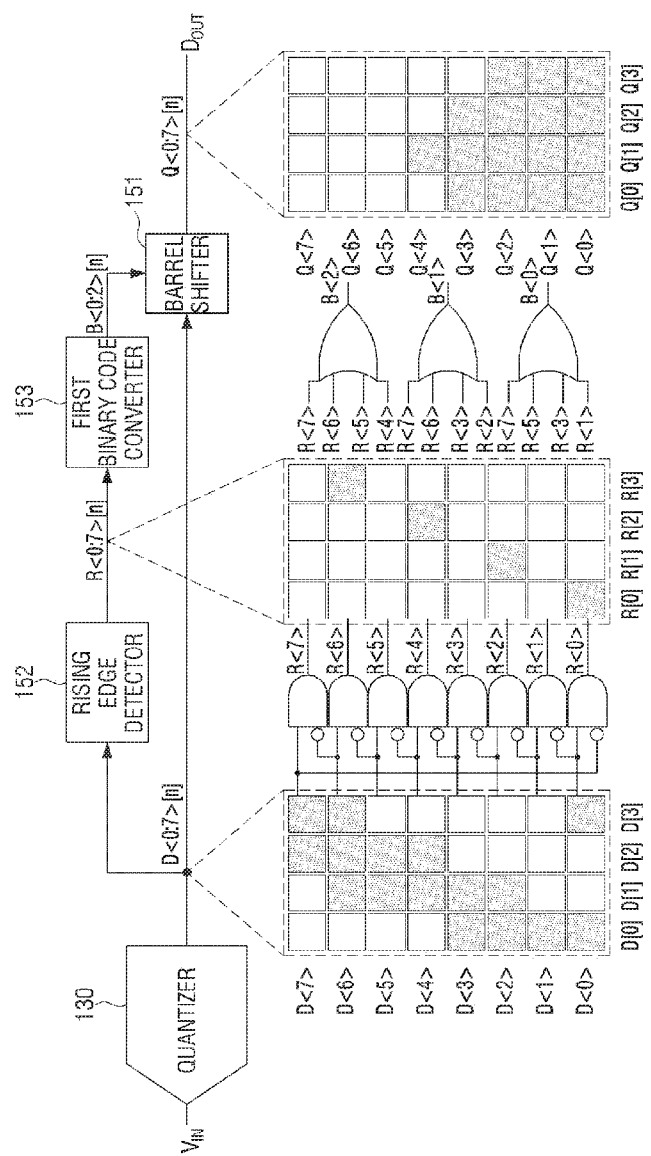
FIG. 8 is a diagram for explaining a process of generating a thermometer code according to an exemplary embodiment of the present disclosure.

FIG. 8 is a diagram for explaining a process of generating a thermometer code according to an exemplary embodiment of the present disclosure.

According to an exemplary embodiment, the quantizer 130 may output 1 from D[0] to D[3] and 0 from D[4] to D[7] in a first period. The quantizer 130 may output 1 from D[2] to D[6] and 0 from D[7] to D[1] in a second period. The quantizer 130 may output 1 from D[4] to D[7] and 0 from D[0] to D[3] in a third period. The quantizer 130 may output 1 from D[6] to D[0] and 0 from D[1] to D[5] in a fourth period.

The rising edge detector 152 may detect a point changed from 0 to 1 among the output values of the quantizer 130. Therefore, the rising edge detector 152 may detect D[0] in the first period, D[2] in the second period, D[4] in the third period, and D[6] in the fourth period.

The first binary code converter 153 may convert the value detected by the rising edge detector 152 into a binary code. For example, the first period may be converted into 000, the second period may be converted into 010, the third period may be converted into 100, and the fourth period may be converted into 110. The barrel shifter 151 shifts the output value of the quantizer 130 by a size corresponding to the converted binary code. The barrel shifter 151 may shift the output value of the first period by 0 column, the output value of the second period by two columns, the output value of the third period by four columns, and the output value of the fourth period by six columns. Therefore, the data weighted averaging 150 may convert the output value of the quantizer 130 into the thermometer array as illustrated in FIG. 8.

Figure 9:
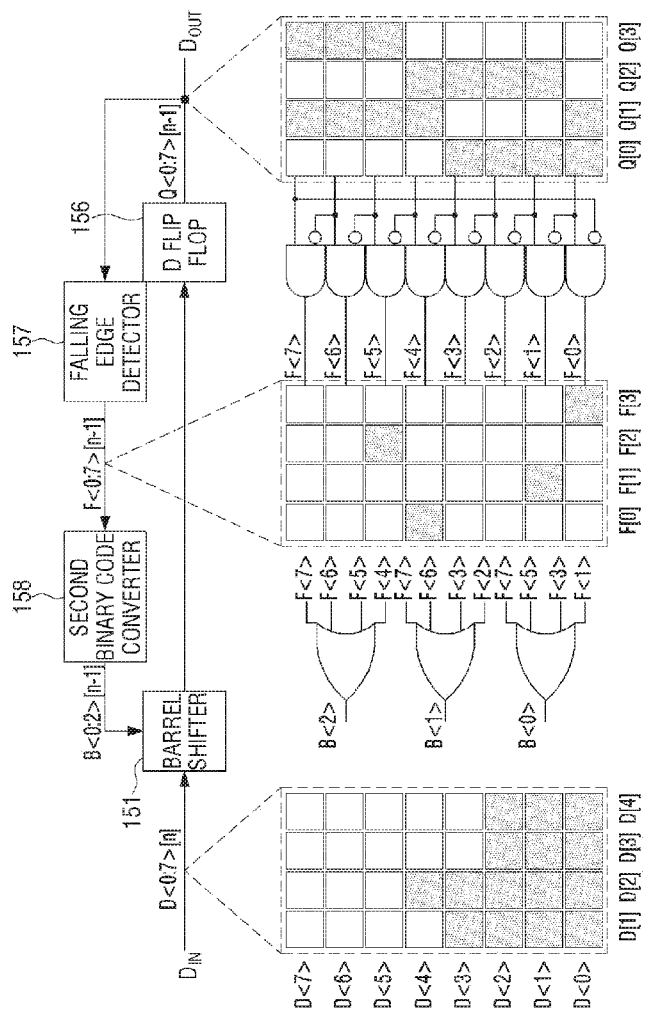
FIG. 9 is a diagram for explaining a process of generating a data weighted average code according to an exemplary embodiment of the present disclosure.

FIG. 9 is a diagram for explaining a process of generating a data weighted average code according to an exemplary embodiment of the present disclosure.

Referring to FIG. 9, the value of the first period converted into the thermometer array is input to the barrel shifter 151. The barrel shifter 151 does not shift the input value since there is no previous value. Therefore, a value of 1 from D[0] to D[3] in the first period may be input to the D flip-flop 156 and falling edge detector 157. The falling edge detector 157 may detect a point changed from 1 to 0 among the values of the first period. That is, the falling edge detector 157 may detect the point D[4] of the first period. The second binary code converter 158 may convert the detected D[4] of the first period into a binary value.

Further, the barrel shifter 151 uses the D[4] converted into the binary value to shift the value of the second period converted into the thermometer array. Therefore, the barrel shifter 151 shifts the input value of 1 of the second period to the D[4]. Further, the barrel shifter 151 outputs the shifted value (i.e., 1 from D[4] to D[0]) of the second period. The falling edge detector 157 may detect a point changed from 1 to 0 based on the value of the second period output from the barrel shifter 151. That is, the falling edge detector 157 may detect the point D[1] of the second period. The second binary code converter 158 may convert the detected D[1] of the second period into the binary value.

Further, the barrel shifter 151 uses the D[1] converted into the binary value to shift the value of the third period converted into the thermometer array. Therefore, the barrel shifter 151 shifts an input value of 1 of the third period to the D[1]. Further, the barrel shifter 151 outputs the shifted value (i.e., 1 from D[1] to D[4]) of the third period. The falling edge detector 157 may detect the point changed from 1 to 0 based on the value of the third period output from the barrel shifter 151. That is, the falling edge detector 157 may detect point D[5] of the third period. The second binary code converter 158 may convert the detected D[5] of the third period into the binary value.

Further, the barrel shifter 151 uses the D[5] converted into the binary value to shift the value of the fourth period converted into the thermometer array. Therefore, the barrel shifter 151 shifts the input value of 1 of the fourth period to the D[5]. Further, the barrel shifter 151 outputs the shifted value (i.e., 1 from D[5] to D[7]) of the fourth period. By the foregoing process, the thermometer code may be converted into the DWA code.

Figures 10A, 10B, 10C:
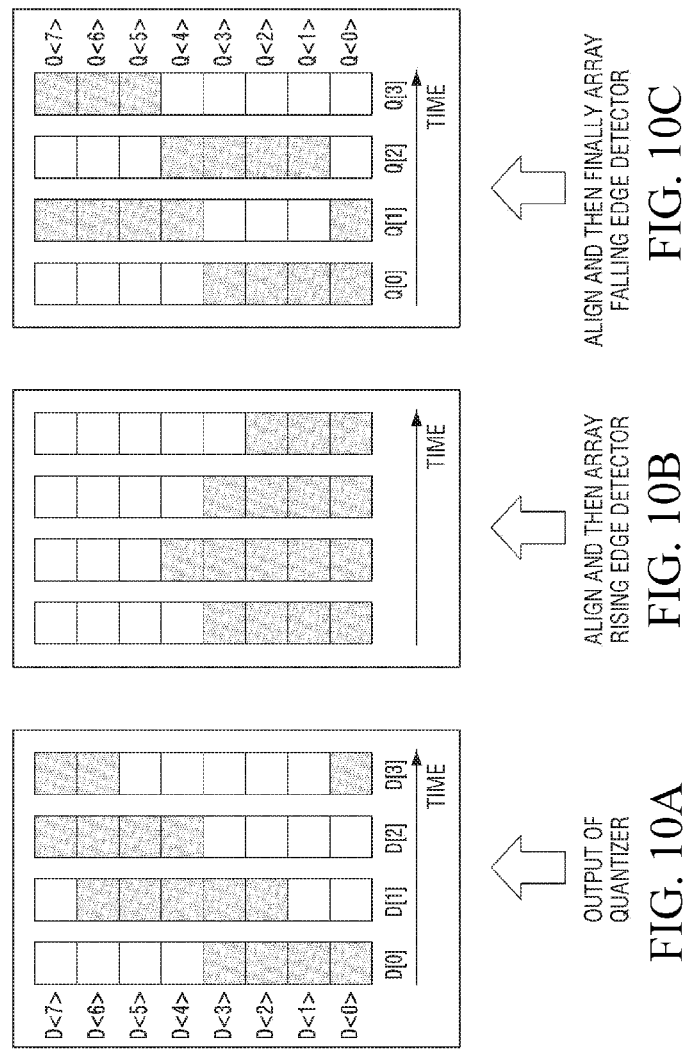
FIGS. 10A to 10C are diagrams for explaining an operation process of a data weighted average algorithm according to an exemplary embodiment of the present disclosure.

FIGS. 10A to 10C are diagrams for explaining an operation process of a data weighted average algorithm according to an exemplary embodiment of the present disclosure.

The operation of the data weighted averaging algorithm illustrated in FIGS. 10A to 10C is the same as that described in FIGS. 8 and 9. That is, as illustrated in FIG. 10A, the quantizer outputs a quantized signal including phase information. Further, as illustrated in FIG. 10B, the signal output from the quantizer may be arrayed in the thermometer code by the rising edge detector and a peripheral circuit. Further, as illustrated in FIG. 10C, the signal arrayed in the thermometer code may be finally arrayed as the DWA code by the falling edge detector and the peripheral circuit.

In other words, the first digital to analog converter 142 is connected to the output terminal of the data weighted averaging 150 and outputs the feedback signal. At this point, the first digital to analog converter 142 includes a first digital to analog converter 142a having two output terminals and a D flip flop 142b connected thereto, in which the operation of the D flip flop 142b is controlled by a clock signal CLK.

Further, the second digital to analog converter 143 is connected to the input terminal of the data weighted averaging. At this point, the second digital to analog converter 143 includes a second digital to analog converter 143a having two output terminals and a D flip flop 143b connected thereto, in which the operation of the D flip flop is controlled by an inverting signal CLKB of the clock signal. The output signal of the positive output terminal of the second digital to analog converter 143a is input to the fifth arithmetic operator 125, and the output signal of the negative output terminal of the second digital to analog converter 143a is input to the sixth arithmetic operator 126.

The analog to digital converter 100 according to the exemplary embodiment of the present disclosure is summarized as follows based on the above description.

The analog to digital converter 100 according to the exemplary embodiment of the present disclosure converts a structure of a voltage domain into a structure of a phase domain, and thus the quantizer 130 simultaneously implements the functions of the integrator and the comparator and the oscillator (VCO) generates the reference frequency, thereby removing the problem of causing the frequency difference due to the process variation. That is, the two oscillators in the same chip have no characteristic difference due to the process variation, and therefore output frequencies of the two oscillators have the same value. The features do not generate a DC offset due to a relative frequency difference, thereby solving the problem of deteriorating the performance of the analog to digital conversion.

Further, the relationship between the input voltage and the output phase of the typical oscillator is expressed by the following Equation 1.

$$V_{out}(s) = V_{in}(s)\frac{K_{vco}}{s} + \frac{f_{common}}{s} \quad \text{[Equation 1]}$$

At this point, the voltage input to the two oscillators has a common DC voltage. Further, when an AC voltage having a phase difference of 180° is input, the transfer function between the input and output phases may be expressed by the following Equation 2.

$$V_{outp}(s) - V_{outn}(s) = \quad \text{[Equation 2]}$$
$$\left(V_{inp}(s)\frac{K_{vco}}{s} + \frac{f_{common}}{s}\right) - \left(V_{inn}(s)\frac{K_{vco}}{s} + \frac{f_{common}}{s}\right)$$
$$\frac{V_{outp}(s) - V_{outn}(s)}{V_{inp}(s) - V_{inn}(s)} = \frac{K_{vco}}{s}$$

Based on the above Equation 2, it may be confirmed that the analog to digital converter 100 according to the exemplary embodiment of the present disclosure is not affected by the common frequency of the oscillator.

Meanwhile, the typical continuous-time delta-sigma modulator (CT-DSM) has a structure in which the feedback DAC enters the input of the first integrator. However, the feedback DAC has a structure consisting of one bit and a structure consisting of several bits. However, the DAC consisting of several bits has a mismatch problem occurring in a CMOS process per bit. Since the influence of the mismatch of the feedback DAC occurs in the input part of the CT-DSM, there is a problem in that the influence may not be removed by using the filtering function of the loop filter.

Accordingly, the analog to digital converter 100 according to the exemplary embodiment of the present disclosure reduces errors due to the mismatch by applying the DWA algorithm to the bit codes to be transmitted to the feedback DAC.

By the way, in the case of the delta sigma modulator having a general comparator, the output code consists of the thermometer code, and thus it is not difficult to implement the DWA operation. However, in the case of the exemplary embodiment of the present disclosure, the output of the quantizer 130 is not the thermometer code but consists of simply a serial array of 1s and 0s, such that there is a problem in that the known DWA structure may not be used. Therefore, according to the exemplary embodiment of the present disclosure, a logical structure capable of implementing the DWA operation is added.

That is, the output of the quantizer 130 is converted into the thermometer code, and the array converted into the thermometer code is again implemented by the DWA operation. In other words, the data weighted averaging 150 converts the quantized output signal to the thermometer code using the barrel shifter 151 based on the portion where the "0 to 1 translation" is translated in the output array. In the similar manner, the data weighted averaging 150 converts the thermometer code to the DWA code using the barrel shifter 151 based on the portion where the "1 to 0 translation" is generated in the thermometer array.

Further, the computing processes are similar to each other, and therefore each barrel shifter is integrated into one to reduce the time consumed in the logical operation process.

Accordingly, the exemplary embodiment of the present disclosure implements the existing integrator and comparator, which are operated in the voltage domain, in the time domain to minimize the power consumption and prevent the performance degradation due to nonlinear operation of the oscillator.

Hereinabove, although the present disclosure is described by specific matters such as concrete components, and the like, exemplary embodiments, and drawings, they are provided only for assisting in the entire understanding of the present disclosure. Therefore, the present disclosure is not limited to the exemplary embodiments. Various modifications and changes may be made by those skilled in the art to which the present disclosure pertains from this description. Therefore, the spirit of the present disclosure should not be limited to the above-described exemplary embodiments, and the following claims as well as all modified equally or equivalently to the claims are intended to fall within the scope and spirit of the disclosure.

What is claimed is:

1. An analog to digital converter, comprising:
    an arithmetic operator combining an analog input signal with a feedback signal;
    a loop filter configured to filter an output signal of the arithmetic operator;
    a quantizer configured to quantize an output signal of the loop filter to output a digital signal; and
    a feedback configured to convert the digital signal to output a feedback signal,
    wherein the quantizer includes:
        a plurality of VCOs each configured to:

receive a positive output signal and a negative output signal of the loop filter, and
output VCO signals;
a plurality of samplers configured to:
receive the VCO signals output from the plurality of VCOs, respectively, and
output sampled signals; and
a phase detector configured to:
detect a phase difference in the sampled signals output from the plurality of samplers, respectively, and
detect a phase difference in two VCO signals output from the plurality of VCOs, respectively.

2. The analog to digital converter as claimed in claim 1, wherein the quantizer is further configured to detect the phase difference in the two VCO signals without inputting a reference frequency signal.

3. The analog to digital converter as claimed in claim 1, wherein the quantizer is further configured to detect the phase difference regardless of a free-running frequency of the plurality of VCOs.

4. The analog to digital converter as claimed in claim 1, wherein the plurality of VCOs includes:
a first ring oscillator including N first inverters operated based on the positive output signal; and
a second ring oscillator including N second inverters operated based on the negative output signal,
wherein, in the first ring oscillator, a negative output terminal of an i-th (i is an integer equal to or greater than 1 but equal to or less than N−1) first inverter of the N first inverters is connected to a positive input terminal of an i+1-th first inverter of the N first inverters and a positive output terminal of the i-th first inverter is connected to a negative input terminal of the i+1-th first inverter, when the N is an even number, a negative output terminal of an N-th first inverter of the N first inverters is connected to a negative input terminal of a 1st first inverter of the N first inverters and a positive output terminal of the N-th first inverter is connected to a positive input terminal of the 1st first inverter, and
wherein, when the N is an odd number, the negative output terminal of the N-th first inverter is connected to the positive input terminal of the 1st first inverter and the positive output terminal of the N-th first inverter is connected to the negative input terminal of the 1st first inverter.

5. The analog to digital converter as claimed in claim 4, wherein the plurality of samplers include:
a first sampler including N first D flip flops connected to output terminals of the N first inverters, respectively; and
a second sampler including N second D flip flops connected to output terminals of the N second inverters, respectively, and
wherein, in the first sampler, a non-inverting input terminal of an i-th first D flip flop is connected to the positive output terminal of the i-th first inverter and an inverting input terminal of the i-th first D flip flop is connected to the negative output terminal of the i-th first inverter.

6. The analog to digital converter as claimed in claim 5, wherein the phase detector includes N XOR gates configured to perform an XOR operation on N sampled signals of the first sampler and N sampled signals of the second sampler, respectively, and
wherein an input terminal of an i-th XOR gate of the N XOR gates is connected to an output terminal of the i-th first D flip flop and an output terminal of the i-th second D flip flop.

7. The analog to digital converter as claimed in claim 1, wherein the feedback includes:
a data weighted averaging (DWA) connected to an output terminal of the quantizer; and
a digital to analog converter (DAC) connected to an output terminal of the data weighted averaging and configured to output the feedback signal, and
wherein the data weighed averaging is configured to:
convert a quantized signal including detected phase information output from the quantizer into a thermometer code, and
convert the converted thermometer code into a DWA code.

8. An analog to digital converter, comprising:
an arithmetic operator configured to combine an analog input signal with a feedback signal;
a loop filter configured to filter an output signal of the arithmetic operator;
a quantizer configured to quantize an output signal of the loop filter to output a digital signal;
a data weighted averaging (DWA) connected to an output terminal of the quantizer; and
a digital to analog converter (DAC) connected to an output terminal of the data weighted averaging and configured to output the feedback signal,
wherein the data weighed averaging is configured to:
convert a digital signal including detected phase information output from the quantizer into a thermometer code, and
convert the converted thermometer code into a DWA code.

9. The analog to digital converter as claimed in claim 8, wherein the data weighed averaging includes:
a barrel shifter having one terminal connected to an output terminal of the quantizer and the other terminal connected to the digital to analog converter;
a rising edge detector configured to detect a rising edge of a digital signal output from the quantizer;
a first binary code converter configured to convert an output signal of the rising edge detector into a binary code;
a flip flop configured to sample an output signal of the barrel shifter;
a falling edge detector configured to detect a falling edge of an output signal of the flip flop;
a second binary code converter configured to convert an output signal of the falling edge detector into the binary code; and
a bit operator configured to perform a subtraction operation on an output signal of the first binary code converter and an output signal of the second binary code converter.

10. The analog to digital converter as claimed in claim 9, wherein the barrel shifter is configured to perform an operation based on an output signal of the bit operator.

* * * * *